United States Patent

Doerflinger et al.

[11] B 4,004,194
[45] Jan. 18, 1977

[54] MODULE FOR SUPPORTING CIRCUIT BOARDS

[75] Inventors: Karl Doerflinger; Hermann Renner, both of Munich; Richard Theus, Wolfratshausen, all of Germany

[73] Assignee: Siemens Aktiengesellschaft, Berlin & Munich, Germany

[22] Filed: Sept. 23, 1974

[21] Appl. No.: 508,639

[44] Published under the second Trial Voluntary Protest Program on March 23, 1976 as document No. B 508,639.

[30] Foreign Application Priority Data

Sept. 27, 1972 Germany .......................... 2348687

[52] U.S. Cl. ............................ 317/100; 174/35 R; 317/101 R; 317/101 DH; 317/120
[51] Int. Cl.² ......................................... H05K 7/14
[58] Field of Search ............. 174/35 R, 35 MS, 50, 174/52 R; 317/99, 100, 101 R, 101 CB, 101 DH, 101 D, 120; 312/223

[56] References Cited

UNITED STATES PATENTS

| | | | |
|---|---|---|---|
| 2,379,189 | 6/1945 | Rupp | 174/35 MS |
| 3,177,407 | 4/1965 | Paterson | 317/101 DH |
| 3,231,663 | 1/1966 | Schwartz | 174/35 MS |
| 3,375,408 | 3/1968 | Buhrendorf | 317/101 CB |
| 3,390,226 | 6/1968 | Beyerlein | 174/35 MS |
| 3,733,523 | 5/1973 | Reynolds | 317/101 DH |
| 3,858,091 | 12/1974 | Wilkinson | 317/120 |

FOREIGN PATENTS OR APPLICATIONS 2,014,806    10/1971    Germany

*Primary Examiner*—Gerald P. Tolin
*Attorney, Agent, or Firm*—Hill, Gross, Simpson, Van Santen, Steadman, Chiara & Simpson

[57] ABSTRACT

A plug-in module for supporting therein plug-in circuit boards incorporating electrical components, the module having on the inner surface of its side walls supporting rails for the plug-in circuit boards and suspension rails on one of the external sides for suspending the module in an assembly system, said moudle being a one piece integral unit made of a metalized synthetic material having good shielding characteristics and having the ability to dissipate heat.

5 Claims, 2 Drawing Figures

MODULE FOR SUPPORTING CIRCUIT BOARDS

This invention relates to modules used to support printed circuit boards therein.

Where assembly systems are used in electrical telecommunications work are concerned, it is well known to arrange several circuit boards containing electrical components in a module and to attach the modules one above the other and side by side in plug in fashion to an assembly wall. A module of this kind has been described, for example, in German Auslegeschrift No. 2,014,806 in particular in FIG. 3 thereof.

When installing or grouping a plurality of electrical components in a small space, it is particularly important that good screening or shielding and good heat dissipation be achieved so that the quality of commuications transmission is maintained.

SUMMARY OF THE INVENTION

An object of the present invention is to create a module for accommodating printed circuit boards incorporating electrical components, said module to have good screening or shielding characteristics and good heat dissipation characteristics.

It is another object of the invention to design a module which comprises a case or container which is made of synthetic material and is made as one complete integral unit.

It is another object of the invention to make a module of synthetic material which is metalized and which has incorporated therein a certain amount of graphite by which not only good shielding characteristics vis-a-vis adjacent modules is achieved but also the heat dissipation characteristics are improved.

Another object of the inveniton is to provide a module that can be manufactured in one operation, such as by molding, so that the cost involved in manufacture is substantially reduced.

Other objects and advantages of the invention will become more clearly apparent when the following description is considered in connection with the accompanying drawings.

DESCRIPTION OF A PREFERRED EMBODIMENT

Figure 1:
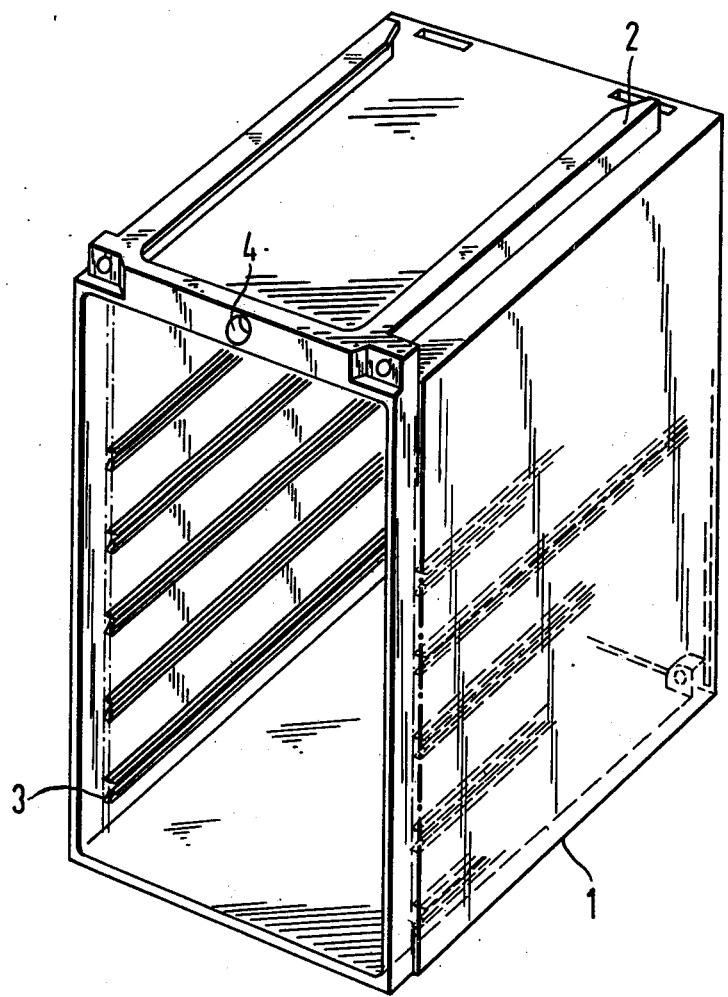
FIG. 1 is a perspective view of a module of the invention made of synthetic material and showing the module without a partition wall.

In FIG. 1 there is shown a module 1 which comprises a substantially rectangular structure having a top wall, a pair of side walls, and a bottom wall, the ends thereof being open. This module is produced from a synthetic material such as by a molding process in a single operation. Since it can be made in a single molding operation, the manufacturing cost advantageously is held to a minimum. The synthetic material may be metalized by electrolytic deposition, such as by plating same with a metal. This will give the structure good shielding characteristics as well as good heat dissipation characteristics. Graphite is mixed into the synthetic material. The synthetic material may also have been metalized by mixing metal into the material itself.

On the top wall of the module, a suspension means 2 is formed, said suspension means comprising a pair of rails extending parallel to the side walls. These rails or runners are adapted to engage with mating rails attached to an assembly system.

Inside the housing on the side walls, support means in the nature of grooves 3 are provided which run parallel to the top and bottom walls. These grooves 3 are provided to accommodate printed circuit boards carrying electrical components.

The attachment of the module 1 to the assembly system is made through a bolt connection which bolt is inserted through the opening 4 on the rear of the module. In order to attach the plug-in trays or the printed circuit boards to the assembly system, a printed circuit board (not shown) is attached in a manner as described in German Patent specification 2,014,806.

Figure 2:
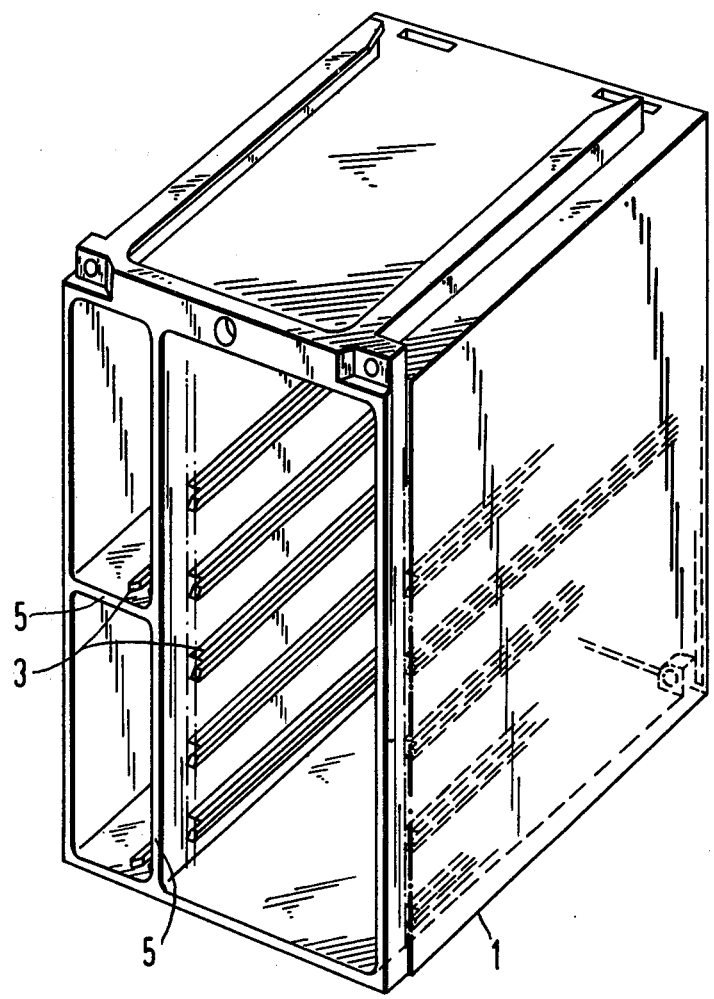
FIG. 2 is a perspective view of a modified form of the module in which the module has a partition wall.

The module shown in FIG. 2 is identical in design to that shown in FIG. 1, with the exception that it contains horizontal and vertical partition walls 5 in order to subdivide the overall housing space within the module. The supporting grooves 3 in the structure of FIG. 2 are arranged similarly to the grooves 3 shown in FIG. 1.

While preferred embodiments of the invention have been disclosed, it will be appreciated that these have been shown by way of example only and the invention is not to be limited thereto as other variations probably will become apparent to those skilled in the art and the invention is to be given its fullest possible interpretation within the terms of the following claims.

What is claimed is:

1. A module for supporting printed circuit boards therein comprising:
    a top wall, a pair of side walls connected to said top wall, and a bottom wall connected to said side walls;
    suspension means fixed to the outside surface of one of said walls for connecting said module into an assembly system;
    support means mounted on the inside surface of said side walls for supporting printed circuit boards therein; and
    said module comprising an integral one piece unit of synthetic material, said synthetic material being metallized and having graphite incorporated therein.

2. The module of claim 1 wherein said synthetic material of which said module is constructed is coated with a metallic material.

3. The module of claim 1 wherein said suspension means comprise a pair of guide rails fixed to said top wall and extending parallel to said side walls.

4. The module of claim 1 wherein said module is formed with at least one partition wall.

5. The module of claim 1 wherein said module is formed with one vertical partition wall and one horizontal partition wall.

* * * * *